(12) United States Patent
Yoshioka et al.

(10) Patent No.: US 8,285,406 B2
(45) Date of Patent: *Oct. 9, 2012

(54) AUDIO PROCESSOR

(75) Inventors: Shinji Yoshioka, Daito (JP); Yoshinori Sawa, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 715 days.

This patent is subject to a terminal disclaimer.

(21) Appl. No.: 12/463,672

(22) Filed: May 11, 2009

(65) Prior Publication Data

US 2009/0287329 A1  Nov. 19, 2009

(30) Foreign Application Priority Data

May 13, 2008  (JP) .................................. 2008-126426

(51) Int. Cl.
*G06F 17/00* (2006.01)
(52) U.S. Cl. .......................................................... 700/94
(58) Field of Classification Search .................... 700/94; 704/500–504; 381/119, 61
See application file for complete search history.

(56) References Cited

U.S. PATENT DOCUMENTS

| | | | |
|---|---|---|---|
| 6,631,352 B1 * | 10/2003 | Fujita et al. .................... | 704/500 |
| 6,873,274 B2 * | 3/2005 | Oki ................................ | 341/143 |
| 6,901,462 B2 | 5/2005 | Minoshima et al. | |
| 2001/0019366 A1 | 9/2001 | Hida | |
| 2003/0179116 A1 | 9/2003 | Oki | |
| 2005/0080500 A1 | 4/2005 | Kimura | |
| 2006/0080094 A1 * | 4/2006 | Katayama et al. ............ | 704/229 |
| 2007/0058953 A1 | 3/2007 | Mantani | |
| 2008/0037151 A1 * | 2/2008 | Fujimoto et al. ................ | 360/18 |

FOREIGN PATENT DOCUMENTS

| | | |
|---|---|---|
| EP | 0 468 346 A2 | 1/1992 |
| JP | 2001-143394 A | 5/2001 |
| JP | 2002-344561 A | 11/2002 |
| JP | 2003-299179 A | 10/2003 |
| JP | 2005-277791 A | 10/2005 |
| JP | 2007-80347 A | 3/2007 |

OTHER PUBLICATIONS

European Search Report dated Aug. 17, 2009 (six (6) pages).

* cited by examiner

*Primary Examiner* — Andrew C Flanders
(74) *Attorney, Agent, or Firm* — Crowell & Moring LLP

(57) ABSTRACT

An audio processor is provided which includes a digital signal processor for processing a digital audio data in an inputted digital audio file and a digital analog converter for converting the digital audio data processed by the digital signal processor into an analog audio data in accordance with a sampling frequency of the digital audio data. The digital signal processor adds a silent data of predetermined amount of time which is the same or longer as time for completing a setting of the sampling frequency in a beginning of the digital audio data in the inputted digital audio file.

6 Claims, 2 Drawing Sheets

AUDIO PROCESSOR

BACKGROUND OF THE INVENTION

1. Field of the Invention

The present invention relates to an audio processor which converts an inputted digital audio data into an analog audio data.

2. Description of the Related Art

Conventionally, an audio processor which converts an inputted digital audio data into an analog audio data converts the digital audio data into the analog audio data at a sampling frequency of the digital audio data (a sampling frequency when converting the digital audio data from the analog audio data into the digital audio data). That is to say, when the digital audio data is inputted, such an audio processor firstly adjusts the sampling frequency to convert the digital audio data into the analog audio data to be same as the sampling frequency of the inputted digital audio data, and subsequently converts the inputted digital audio data into the analog audio data at the adjusted sampling frequency. The converted analog audio data is outputted to a speaker, and the speaker reproduces an audio based on the inputted digital audio data.

When the digital audio data is inputted, the above audio processor carries out a mute processing so as not to output the analog audio data which is converted from the digital audio data until the adjustment of the sampling frequency is completed. As a result, a sound interrupt (the audio is not reproduced) often occurs at the beginning of the audio to be reproduced (the audio based on the inputted digital audio data) due to the mute processing.

There is a known audio processor which avoids the sound interrupt at the beginning of the audio (refer to Japanese Laid-Open Patent Publication No. 2007-80347, for example). The audio processor (digital amplifier) described in the above publication No. 2007-80347 avoids the sound interrupt at the beginning of the audio (the audio based on the digital audio data) by converting the digital audio data into the analog audio data after waiting a time for adjusting the sampling frequency.

Meanwhile, there is a known broadcasting receiver for receiving a radio broadcasting which outputs an audio of an analog broadcasting, which has the same contents as a digital broadcasting, while a setting of a signal processing unit is changed when the sampling frequency of the digital broadcasting is changed (refer to Japanese Laid-Open Patent Publication No. 2005-277791, for example). Moreover, among receiving apparatuses which records audio data received from network in a buffer and reads out the audio data recorded in the buffer in accordance with a reference clock, there is a known receiving apparatus which clears an audio data recorded in the buffer when the sampling frequency of the audio data is changed (refer to Japanese Laid-Open Patent Publication No. 2002-344561, for example). Moreover, there is a known reproducing apparatus for reproducing a digital audio data which prevents a noise generation which occurs when switching a mode of reproduction (refer to Japanese Laid-Open Patent Publication No. 2001-143394, for example).

However, in the above audio processor described in the publication No. 2007-80347, the inputted digital audio data is converted into the analog audio data after waiting the time for adjusting the sampling frequency, so that the processing of the digital audio data becomes complex. Besides, even when applying the contents disclosed in the above publication Nos. 2005-277791, 2002-344561, and 2001-143394, the above problem cannot be resolved.

SUMMARY OF THE INVENTION

An object of the present invention is to provide an audio processor which can avoid a sound interrupt at the beginning of an audio to be reproduced by a simple processing.

According to the present invention, this object is achieved by an audio processor for converting a digital audio data in an inputted digital audio file into an analog audio data, comprising: a digital signal processor for processing a digital audio data in an inputted digital audio file, and a digital analog converter for converting the digital audio data processed by the digital signal processor into the analog audio data in accordance with a sampling frequency of the digital audio data.

The digital signal processor adds a silent data of time which is the same or longer as time for completing a setting of the sampling frequency in the digital signal processor in a beginning of the digital audio data in the inputted digital audio file.

According to the above configuration, when the digital audio file is reproduced, a silent data is firstly converted into the analog audio data, and subsequently, a normal digital audio data (a digital audio data which is originally included in the digital audio file) in the digital audio file is converted into the analog audio data. Consequently, when the digital audio file is reproduced, the audio processor can convert the normal digital audio data in the digital audio file into the analog audio data after completing the setting of the sampling frequency, and the sound interrupt can be avoided at the beginning of the audio to be reproduced. Moreover, the audio processor can avoid the sound interrupt at the beginning of the audio by a simple processing for adding the silent data in the beginning of the digital audio data in the digital audio file.

When there is a plurality of the inputted digital audio files, the digital signal processor can add the silent data in the beginning of the digital audio data in the digital audio file, which is inputted first among the plural digital audio files which start to be inputted. Consequently, when the digital audio file, which is inputted first among the plural digital audio files which start to be inputted, is reproduced, the audio processor can avoid the sound interrupt at the beginning of the audio to be reproduced.

It is preferable that when there is the plurality of the inputted digital audio files, the digital signal processor adds the silent data in the beginning of each digital audio data in the plural digital audio files which are successively inputted. Consequently, when each of the digital audio files which are successively inputted is reproduced, the audio processor can avoid the sound interrupt at the beginning of the audio to be reproduced.

BRIEF DESCRIPTION OF THE DRAWINGS

The present invention will be described below with reference to the annexed drawings. It is to be noted that all the drawings are shown for the purpose of illustrating the technical concept of the present invention or embodiments thereof, wherein.

DESCRIPTION OF THE PREFERRED EMBODIMENTS

Figure 1:
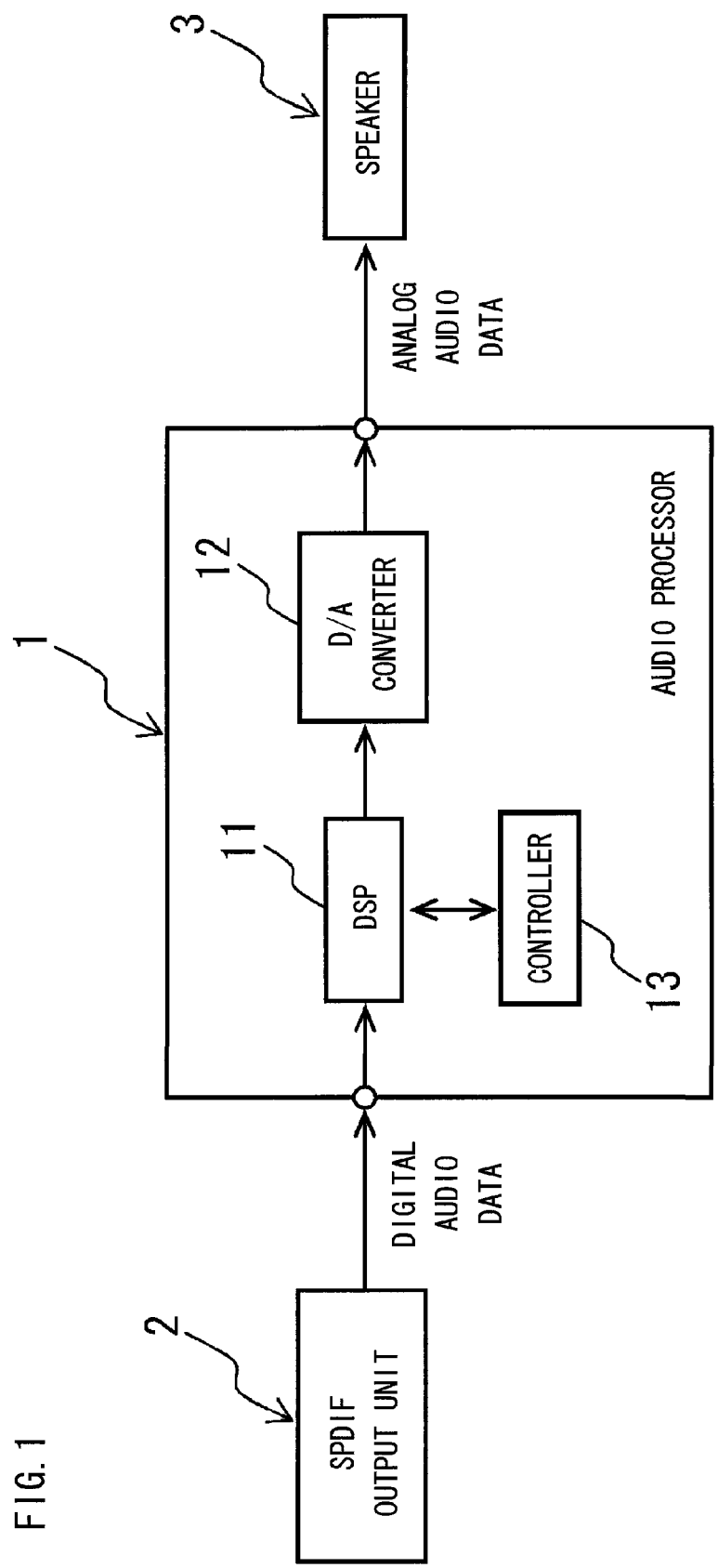
FIG. 1 is an electrical block diagram showing a schematic configuration of an audio processor according to a preferred embodiment of the present invention.

An audio processor according to a preferred embodiment of the present invention is described below with reference to FIGS. 1 and 2. FIG. 1 shows a configuration of an audio processor according to the present preferred embodiment. An audio processor 1 is connected between a SPDIF output unit 2 and a speaker 3 and reproduces an audio through the speaker 3 based on a digital audio data outputted from the SPDIF output unit 2. In other words, the digital audio data outputted from the SPDIF output unit 2 is inputted to the audio processor 1, and the audio processor 1 converts the inputted digital audio data into an analog audio data and outputs the converted analog audio data to the speaker 3.

The SPDIF output unit 2, which is a DVD player, CD player, digital media server, and so on, outputs the digital audio data in SPDIF format (Sony Philips Digital Interface Format). Moreover, the SPDIF output unit 2 outputs the digital audio data in form of a digital audio file. In other words, the SPDIF output unit 2 makes up the digital audio file from the digital audio data, a sampling frequency data which indicates a sampling frequency when converting the analog audio data into the digital audio data, and so on and outputs the digital audio data in the form of the digital audio file.

The audio processor 1 includes a DSP (digital signal processor) 11 to process a digital data, a D/A converter (digital analog converter) 12 to convert the digital data into an analog data, a controller 13 to control an operation of the audio processor 1, and so on.

The DSP 11 analyzes the digital audio file inputted from the SPDIF output unit 2 and subsequently separates and extracts a sampling frequency data and a digital audio data from the digital audio file. Moreover, the DSP 11 outputs the sampling frequency data which is separated and extracted from the digital audio file to the controller 13. After carrying out a predetermined data processing of the digital audio data separated and extracted from the digital audio file, the DSP 11 outputs the processed digital audio data to the D/A converter 12.

The D/A converter 12 converts the processed digital audio data which is outputted from the DSP 11 into the analog audio data. The analog audio data converted by the D/A converter 12 is outputted to the speaker 3, and the speaker 3 reproduces an audio based on the digital audio data in the digital audio file which is inputted from the SPDIF output unit 2. The controller 13 controls various operations of the audio processor 1.

The above predetermined data processing performed by the DSP 11 includes a decode processing, an error correction processing, and so on. The DSP 11 adds a silent data in the beginning of the digital audio data as the predetermined data processing of the digital audio data. That is to say, the DSP 11 adds the silent data of predetermined amount of time (1 second, for example) in the beginning of the digital audio data in the digital audio file, which is inputted first among the digital audio files which start to be inputted from the SPDIF output unit 2. Moreover, when the plurality of the digital audio files are successively inputted from the SPDIF output unit 2, the DSP 11 adds the silent data of the predetermined amount of time (1 second, for example) in the beginning of each digital audio data in the plurality of the digital audio files which are successively inputted.

The DSP 11 outputs the processed digital audio data to the D/A converter 12 at a sampling frequency of the digital audio data. Consequently, the processed digital audio data is converted into the analog audio data at the sampling frequency of the digital audio data by the D/A converter 12. That is to say, the DSP 11 and the D/A converter 12 convert the processed digital audio data into the analog audio data in accordance with the sampling frequency of the digital audio data.

Figure 2:
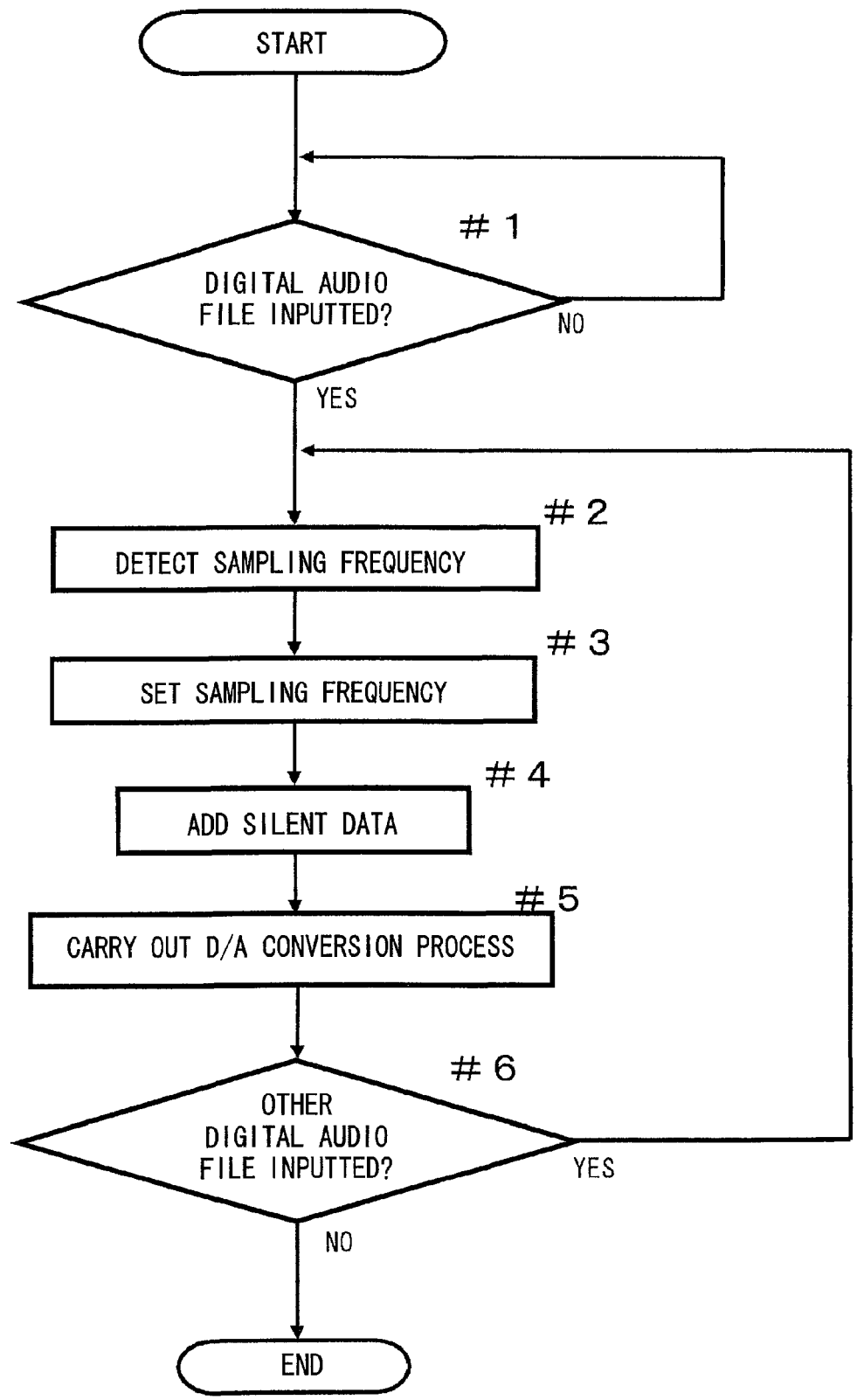
FIG. 2 is a flow chart showing an operation of the audio processor in FIG. 1.

FIG. 2 is a flow chart showing an operation of the audio processor 1. Firstly, when the digital audio file is inputted from the SPDIF output unit 2 (when receiving the digital audio file from the SPDIF output unit 2) (YES in #1), the controller 13 detects the sampling frequency of the digital audio data in the digital audio file (#2).

In other words, when the digital audio file is inputted from the SPDIF output unit 2, the DSP 11 outputs the sampling frequency data included in the digital audio file to the controller 13, and the controller 13 detects the sampling frequency of the digital audio data in the digital audio file which is inputted from the SPDIF output unit 2 based on the sampling frequency data.

Subsequently, the controller 13 sends a command to the DSP 11 to set the sampling frequency (#3), to add the silent data of the predetermined amount of time (1 second, for example) in the beginning of the digital audio data in the digital audio file (#4), and to carry out the D/A conversion process (#5).

Upon receiving the above commands, the DSP 11 sets the sampling frequency for converting the digital audio data into the analog audio data to be the same as the sampling frequency of the digital audio data in the inputted digital audio file, carries out the data processing for adding the silent data of the predetermined amount of time (which is the same as the time for completing the setting of the sampling frequency or longer, 1 second, for example) in the beginning of the digital audio data in the inputted digital audio file, and outputs the processed digital audio data (the digital audio data in which the silent data is added in the beginning) to the D/A converter 12.

The DSP 11 outputs the processed digital audio data to the D/A converter 12 at the predetermined frequency until the setting of the sampling frequency is completed, and after the setting of the sampling frequency is completed, the DSP 11 outputs the processed digital audio data to the D/A converter 12 at the set sampling frequency.

Accordingly, the silent data which is added in the beginning of the digital audio data in the digital audio file is converted into the analog audio data by the D/A converter 12, and subsequently, the normal digital audio data (the digital audio data which is originally included in the digital audio file) in the digital audio file following the silent data is converted into the analog audio data by the D/A converter 12. Consequently, until the setting of the sampling frequency is completed, the silent data is converted into the analog audio data, and the audio reproduced by the speaker 3 becomes silent, and after the setting of the sampling frequency is completed, the normal digital audio data in the digital audio file is converted into the analog audio data, and the audio based on the digital audio file is reproduced by the speaker 3.

Subsequently, when another digital audio file is inputted from the SPDIF output unit 2 (YES in #6), the controller 13 repeats the above steps of #2 to #6. That is to say, when the plurality of the digital audio files are successively inputted, the detection of the sampling frequency, the setting of the sampling frequency, and the addition of the silent data are carried out on each of the plural digital audio files, and subsequently, the digital audio data is converted into the analog audio data.

According to the audio processor 1 having the above configuration, when starting to input the digital audio data, the silent data is firstly converted into the analog audio data when the digital audio file, which is inputted first among the digital audio files which start to be inputted, is reproduced, and subsequently, the normal digital audio data in the digital audio file is converted into the analog audio data. Consequently, when the digital audio file, which is inputted first among the digital audio files which start to be inputted, is reproduced, the audio processor 1 can convert the normal digital audio data in the digital audio file into the analog audio data after completing the setting of the sampling frequency and thereby can avoid the sound interrupt at the beginning of the audio to be reproduced.

Moreover, when the plurality of the digital audio files are successively inputted, the silent data is firstly converted into the analog audio data when each of the digital audio files which are successively inputted is reproduced, and subsequently, the normal digital audio data in the digital audio file is converted into the analog audio data. Consequently, when each of the plural digital audio files which are successively inputted is reproduced, the audio processor 1 can convert the normal digital audio data in the digital audio file into the analog audio data after completing the setting of the sampling frequency and thereby can avoid the sound interrupt at the beginning of the audio to be reproduced.

The present invention is not limited to the configuration of the above preferred embodiment, however, various modification are applicable within the scope of the invention. For example, the present invention can be applied to not only an audio processor connected to a SPDIF output unit which outputs digital audio data in SPDIF format but also an audio processor connected to a unit which outputs digital audio data in non-SPDIF format. In other words, the audio processor according to the present invention can process digital audio data not only in SPDIF format but also in non-SPDIF format. Moreover, in the above preferred embodiment, the audio processor is connected to the speaker, however, the audio processor can incorporate the speaker.

What is claimed is:

1. An audio processor for converting a digital audio data in an inputted digital audio file into an analog audio data, comprising:
   a digital signal processor for processing a digital audio data in an inputted digital audio file; and
   a digital analog converter for converting the digital audio data processed by the digital signal processor into the analog audio data in accordance with a sampling frequency of the digital audio data; and
   a controller for controlling an operation of the audio processor, wherein
   when the controller judges that a digital audio file is inputted to the digital signal processor, the digital signal processor adds a silent data of time which is the same or longer as time for completing a setting of the sampling frequency in the digital signal processor in a beginning of the digital audio data in the inputted digital audio file;
   wherein the digital signal processor outputs processed digital audio data, to which the silent data was added, to the digital analog converter at a predetermined frequency until the setting of the sampling frequency is completed, and after the setting of the sampling frequency is completed, the digital signal processor outputs the processed digital audio data to the digital analog converter at a set sampling frequency.

2. The audio processor according to claim 1, wherein
   when there is a plurality of the inputted digital audio files, the digital signal processor adds the silent data in the beginning of the digital audio data in the digital audio file which is inputted first among the plural digital audio files which start to be inputted.

3. The audio processor according to claim 2, wherein
   when there is the plurality of the inputted digital audio files, the digital signal processor adds the silent data in the beginning of each digital audio data in the plurality of the digital audio files which are successively inputted.

4. An audio processor for converting a digital audio data in an inputted digital audio file into an analog audio data, comprising:
   a digital signal processor for processing a digital audio data in an inputted digital audio file; and
   a digital analog converter for converting the digital audio data processed by the digital signal processor into the analog audio data in accordance with a sampling frequency of the digital audio data, wherein
   the digital signal processor adds a silent data of time which is the same or longer as time for completing a setting of the sampling frequency in the digital signal processor in a beginning of the digital audio data in the inputted digital audio file; and
   the digital signal processor outputs processed digital audio data, to which the silent data was added, to the digital analog converter at a predetermined frequency until the setting of the sampling frequency is completed, and after the setting of the sampling frequency is completed, the digital signal processor outputs the processed digital audio data to the digital analog converter at a set sampling frequency.

5. The audio processor according to claim 4, wherein
   when there is a plurality of the inputted digital audio files, the digital signal processor adds the silent data in the beginning of the digital audio data in the digital audio file which is inputted first among the plural digital audio files which start to be inputted.

6. The audio processor according to claim 5, wherein
   when there is the plurality of the inputted digital audio files, the digital signal processor adds the silent data in the beginning of each digital audio data in the plurality of the digital audio files which are successively inputted.

* * * * *